United States Patent
Pierrat et al.

(10) Patent No.: US 6,721,928 B2
(45) Date of Patent: Apr. 13, 2004

(54) VERIFICATION UTILIZING INSTANCE-BASED HIERARCHY MANAGEMENT

(75) Inventors: Christophe Pierrat, Santa Clara, CA (US); Chin-Hsen Lin, Fremont, CA (US); Fang-Cheng Chang, Sunnyvale, CA (US); Yao-Ting Wang, Atherton, CA (US)

(73) Assignee: Numerical Technologies, Inc., Mountain View, CA (US)

( * ) Notice: Subject to any disclaimer, the term of this patent is extended or adjusted under 35 U.S.C. 154(b) by 0 days.

(21) Appl. No.: 10/323,565

(22) Filed: Dec. 17, 2002

(65) Prior Publication Data

US 2003/0088837 A1 May 8, 2003

Related U.S. Application Data

(63) Continuation-in-part of application No. 09/917,526, filed on Jul. 26, 2001.

(51) Int. Cl.$^7$ ............................................. G06F 17/50
(52) U.S. Cl. .................. 716/4; 716/19; 716/17; 716/21; 716/5; 716/1
(58) Field of Search ........................ 716/4, 1–3, 11–14, 716/19–21

(56) References Cited

U.S. PATENT DOCUMENTS

| | | | |
|---|---|---|---|
| 5,182,718 A | 1/1993 | Harafuji et al. | 364/490 |
| 5,432,714 A | 7/1995 | Chung et al. | 364/525 |
| 5,533,148 A | 7/1996 | Sayah et al. | 382/240 |

(List continued on next page.)

FOREIGN PATENT DOCUMENTS

| | | |
|---|---|---|
| JP | 3-80525 | 4/1991 |
| WO | WO 97/13370 A1 | 4/1997 |
| WO | WO 97/38381 A1 | 10/1997 |
| WO | WO 98/20327 A1 | 5/1998 |
| WO | WO 98/45685 A1 | 10/1998 |
| WO | WO 99/14206 A3 | 3/1999 |
| WO | WO 99/14636 A1 | 3/1999 |
| WO | WO 99/14637 A1 | 3/1999 |
| WO | WO 99/14638 A1 | 3/1999 |
| WO | WO 99/14706 A2 | 3/1999 |
| WO | WO 99/38002 A1 | 7/1999 |
| WO | WO 99/56113 A1 | 11/1999 |
| WO | WO 99/59200 A1 | 11/1999 |
| WO | WO 99/67626 A1 | 12/1999 |
| WO | WO 00/36525 A2 | 6/2000 |
| WO | WO 02/29491 A1 | 4/2002 |

OTHER PUBLICATIONS

Lithas, "Lithas: Optical Proximity Correction Software" (2 pages), no date.

Rieger, M., et al., "Using Behavior Modeling for Proximity Correction", Precim Company, Portland, Oregon (6 pages), no date.

Spence, C., et al., "Detection of 60(degree) Phase Defects on Alternating PSMs", Advanced Micro Devices, KLA—Tencor, DuPont RTC (2 pages), no date.

Sugawara, M., et al., "Defect Printability Study of Attenuated Phase–Shifting Masks for Specifying Inspection Sensitivity", Sony Corporation, Kanagawa, Japan (16 pages), no date.

(List continued on next page.)

Primary Examiner—Matthew Smith
Assistant Examiner—Magid Dimyan
(74) Attorney, Agent, or Firm—Bever, Hoffman & Harms, LLP; Edward S. Mao (57) ABSTRACT

The present invention uses an instance based (IB) representation to reduce the time required for verifying a transformed layout that was generated from a reference layout. Specifically, an IB based representation is generated from the reference layout. The IB based representation includes sets of instance cells that include a master instance cell and slave instance cells. Only a subset of each set of instance cell needs to be simulated to verify the transformed layout.

21 Claims, 11 Drawing Sheets

U.S. PATENT DOCUMENTS

| | | | |
|---|---|---|---|
| 5,538,815 A | 7/1996 | Oi et al. | 430/5 |
| 5,572,598 A | 11/1996 | Wihl et al. | 382/144 |
| 5,657,235 A | 8/1997 | Liebmann et al. | 364/474.24 |
| 5,682,323 A | 10/1997 | Pasch et al. | 364/491 |
| 5,795,688 A | 8/1998 | Burdorf et al. | 430/30 |
| 5,804,340 A | 9/1998 | Garza et al. | 430/5 |
| 5,849,440 A | 12/1998 | Lucase et al. | 430/5 |
| 5,885,734 A | 3/1999 | Pierrat et al. | 430/5 |
| 6,009,250 A | 12/1999 | Ho et al. | 395/500.06 |
| 6,009,251 A | 12/1999 | Ho et al. | 395/500.06 |
| 6,011,911 A | 1/2000 | Ho et al. | 395/500.06 |
| 6,016,357 A | 1/2000 | Neary et al. | 382/144 |
| 6,023,328 A | 2/2000 | Pierrat | 356/237.4 |
| 6,064,806 A | 5/2000 | Lakos et al. | 395/500.04 |
| 6,076,465 A | 6/2000 | Vacca et al. | 101/481 |
| 6,077,310 A | 6/2000 | Yamamoto et al. | 716/19 |
| 6,081,658 A | 6/2000 | Rieger et al. | 395/500.22 |
| 6,091,845 A | 7/2000 | Pierrat et al. | 382/144 |
| 6,130,750 A | 10/2000 | Ausschnitt et al. | 356/401 |
| 6,171,731 B1 | 1/2001 | Medvedeva et al. | 430/5 |
| 6,272,236 B1 | 8/2001 | Pierrat et al. | 382/144 |
| 6,272,671 B1 * | 8/2001 | Fakhry | 716/18 |
| 6,334,209 B1 | 12/2001 | Hashimoto et al. | 716/21 |
| 6,339,836 B1 * | 1/2002 | Eisenhofer et al. | 716/5 |
| 6,346,426 B1 | 2/2002 | Toprac et al. | 438/8 |
| 6,370,679 B1 | 4/2002 | Chang et al. | 716/19 |
| 6,453,452 B1 | 9/2002 | Chang et al. | 716/8 |
| 6,560,766 B2 * | 5/2003 | Pierrat et al. | 716/19 |
| 6,567,958 B1 * | 5/2003 | Runyon et al. | 716/5 |
| 6,571,374 B1 * | 5/2003 | Runyon et al. | 716/5 |
| 6,577,992 B1 * | 6/2003 | Tcherniaev et al. | 703/14 |
| 2002/0010904 A1 | 1/2002 | Ayres | 716/19 |
| 2002/0019729 A1 | 2/2002 | Chang et al. | 703/6 |
| 2002/0152449 A1 | 10/2002 | Lin | 716/17 |
| 2002/0152454 A1 | 10/2002 | Cote et al. | 716/21 |
| 2003/0208721 A1 * | 11/2003 | Regnier | 716/1 |

OTHER PUBLICATIONS

Ogawa, K., et al., "Phase Defect Inspection by Differential Interference", Lasertec Corporation (12 pages), no date.

Socha, R., et al., "Printability of Phase–Shift Defects Using a Perturbational Model", Univ. of California Berkeley, Sematech (11 pages), no date.

Fiekowsky, P., "The End of Thresholds: Subwavelength Optical Linewidth Measurement Using the Flux–Area Technique", Automated Visual Inspection (6 pages), no date.

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Detection and Printability of Shifter Defects in Phase–Shifting Masks II Defocus Characteristics", Jpn. J. Appl. Phys., vol. 31, pp. 4155–4160 (1992).

Iiosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

Lin, B.J., et al., "Single–Level Electric Testsites for Phase–Shifting Masks", SPIE, vol. 1673, pp. 221–228, Mar. 9–11, 1992.

Harafuji, K., et al., "A Novel Hierarchical Approach for Proximity Effect Correction in Electron Beam Lithography", IEEE, vol. 12, No. 10, pp. 1508–1514, Oct. 1993.

Rieger, M., et al., "System for Lithography Proximity Compensation", Precim Company, Portland, Oregon, Sep. 1993 (28 pages).

Wiley, J., et al., "Device Yield and Reliability by Specification of Mask Defects", Solid State Technology, vol. 36, No. 7, pp. 65–66, 70, 72, 74, 77, Jul. 1993.

Ohtsuka, H., et al., "Evaluation of Repair Phase and Size Tolerance for a Phase–Shift Mask", J. Sci. Vac. Technol. B, vol. 11, No. 6, pp. 2665–2668, Nov./Dec. 1993

Galan, G., et al., "Application of Alternating–Type Phase Shift Mask to Polysilicon Level for Random Logic Circuits", Jpn. J. Appl. Phys., vol. 33, pp. 6779–6784 (1994).

Karklin, L., "A Comprehensive Simulation Study of the Photomask Defects Printability", SPIE, vol. 2621, pp. 490–504 (1995).

Wiley, J., et al., "The Effect of Off–Axis Illumination on the Printability of Opaque and Transparent Reticle Defects", SPIE, vol. 2512, pp. 432–440 (1995).

Reynolds, J., "Elusive Mask Defects: Reflectivity Variations", Solid State Technology, pp. 75–76, Mar. 1995.

Kusunose, H., et al., "Direct Phase–Shift Measurement with Transmitted Deep–UV Illumination", SPIE, vol. 2793, pp. 251–260 1996).

Vacca, A., et al., "100nm Defect Detection Using a Dynamically Programmable Image Processing Algorithm", SPIE, vol. 3236 (1997) (Abstract Only).

Tsujimoto, E., et al., "Hierarchical Mask Data Design System (Prophet) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Vacca, A., et al., "100nm Defect Detection Using an Existing Image Acquisition System", SPIE, vol. 3236, pp. 208–221 (1998).

Fiekowsky, P., et al., "Defect Printability Measurement on the KLA–351: Correlation to Defect Sizing Using the AVI Metrology System", SPIE 19th Annual BACUS Symposium on Photomask Technology and Management Conference, pp. 1–6, Sep., no date.

Tejnil, E., et al., "Option for At–Wavelength Inspection of Patterned Extreme Ultraviolet Lithography Masks", SPIE Bacus '99, pp. 1–12 (1999).

Hemar, S., et al., "Finding Killer CD Variations by Full–Reticle CD Mapping", Microlithography World, pp. 4, 6, 8 & 10 (Summer 2000).

* cited by examiner

```
T
{
    REF LIST AT_A, BT_B
}
A
{
    ▨▨▨▨▨
    REF LIST CT_CA
}
B
{
    ▨▨
}
C
{
    ▨
}
```

VERIFICATION UTILIZING INSTANCE-BASED HIERARCHY MANAGEMENT

RELATED APPLICATIONS

This application is a continuation-in-part of, claims the benefit of, priority of, and incorporates by reference, the U.S. patent application Ser. No. 09/917,526 filed Jul. 26, 2001, entitled "Method and Apparatus for Analyzing a Layout Using an Instance-Based Representation", having inventors Christophe Pierrat, Chin-Hsen Lin, Fang-Cheng Chang, and Yao-Ting Wang, and assigned to the assignee of the present invention.

BACKGROUND OF THE INVENTION

1. Field of the Invention

The invention relates to the process of designing an integrated circuit. More specifically, the invention relates to a method and an apparatus for using verifying an instance-based representation of a set of geometrical features that comprise a layout of a circuit on a semiconductor chip.

2. Description of the Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process generally begins with the formation of a photoresist layer on the surface of a semiconductor wafer. A mask composed of opaque regions, which are generally formed of chrome, and light-transmissive clear regions, which are generally formed of quartz, is then positioned over this photo resist layer coated wafer. (Note that the term "mask" as used in this specification is meant to include the term "retical.") Light is then shone on the mask from a visible light source or an ultraviolet light source.

This light is generally reduced and focused through an optical system that contains a number of lenses, filters and mirrors. The light passes through the clear regions of the mask and exposes the underlying photoresist layer. At the same time, the light is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching underlying regions of the wafer.

Figure 1A:
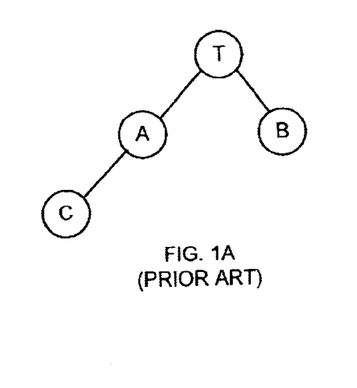
FIG. 1A illustrates a hierarchical representation of a layout in nodal form.
Figure 1B:
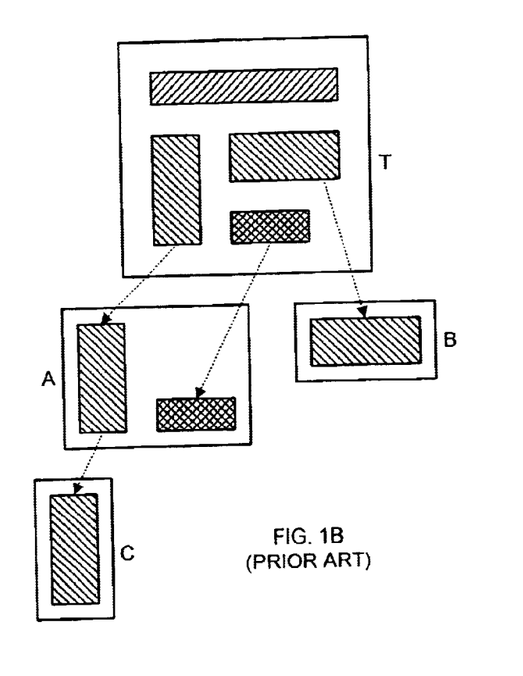
FIG. 1B illustrates a hierarchical representation of the layout in graphical form.
Figure 1C:
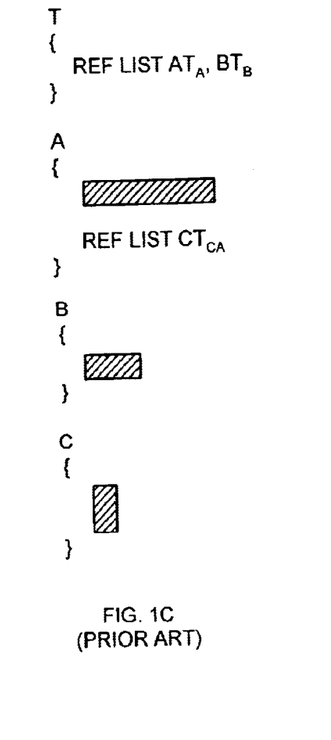
FIG. 1C illustrates a hierarchical representation of the layout in code form.

A layout for a semiconductor chip is often stored in a standard hierarchical format, such as GDSII stream format. For example, FIGS. 1A, 1B and 1C illustrate how a layout T, can be composed of a sub-instance cell A and a sub-instance cell B, wherein the sub-instance cell A further includes a sub-instance cell C. FIG. 1A illustrates a nodal representation of this hierarchy, while FIG. 1B illustrates a corresponding graphical representation.

FIG. 1C presents a specification of the layout in code form. In this form, the layout, T, includes a reference list. This reference list includes a reference to instance cell A along with an associated transformation, $T_A$, and a reference to instance cell B along with an associated transformation, $T_B$. Similarly, the layout for instance cell A includes geometrical features associated with instance cell A along with a reference instance cell C. This reference to instance cell C is accompanied by a transformation of instance cell C with respect to A, $T_{CA}$. The layouts for instance cell B and instance cell C include geometrical features associated with instance cell B and instance cell C, respectively.

Representing a layout in a hierarchical format can cause problems for various operations related to production of a semiconductor chip, such as die-to database inspection of a mask, defect analysis on a wafer or a mask, verification of a layout against a simulated silicon image of the layout, and proximity effect correction during mask writing.

During any of these operations, interactions between nodes within the hierarchical representation can cause erroneous results. This problem can be remedied by collapsing the hierarchy down into a single monolithic layout before performing the operations. Unfortunately, this technique can be prohibitively slow because the operations must be applied to the entire layout, even though many of the instance cells in the layout may be repeated.

Therefore, a need arises for a system and method of efficiently processing a layout using a hierarchical representation without the above-describe problems.

SUMMARY OF THE INVENTION

Accordingly, the present invention uses IB based representation to rapidly process a transformed layout. Specifically in one embodiment of the present invention a transformed layout, which was generated from a reference layout is verified using an IB based representation that is also generated from the reference layout.

The IB-based representation includes sets of instance cells. In general the sets include a master instance cells and slave instance cells. Although not all sets include slave instance cells. Because in an IB-based representation the slave instances share the same geometries as the master instances all the instances in a set have the same geometry. In general, the generation of the transformed layout is more subject to systemic errors rather than random errors. Thus, if all the instance cells in a set have the same geometry verifying a subset of instance cells provides adequate verification that all the instance cells of the set are generated correctly.

Thus, in accordance with one embodiment of the present invention, a subset of each set of instance cells is selected from the IB based representation. In some embodiments the subset consists of just the master instance cell of the set. In other embodiments the subset includes one or more slave instance cells. In still other embodiments of the present invention the subset includes the master instance cell and one or more slave instance cells. For each instance cell in the subset, the corresponding area of the transformed layout is simulated to generate a simulation image. The simulation image is then compared with the instance cell. For instance cells that are not in the subset, the comparison results can be copied from one of the instance cells within the subset.

DETAILED DESCRIPTION

An instance-based (IB) representation is a hierarchical design representation that is designed to allow parallel processing of a design hierarchy. In some embodiments, this is accomplished by restructuring the (or alternatively creating a new) hierarchical layout into a format in which the hierarchy information is separated from the geometrical shapes (and other information). Further, in the IB representation, the geometrical shapes and information may be stored as instances. Each instance in the IB representation (sometimes referred to as a physical instance cell) includes a geometry information from the original instance cell (sometimes referred to as the actual instance cell) together with associated environment (e.g. structures within a halo, certain proximity, or interaction range of the instance cell).

Once a hierarchical design is processed into an IB representation it is possible to perform tasks in parallel on the instance cells. That is because each instance cell includes the necessary information about the relevant neighboring (in a physical/geometrical sense) structures in the layout. Further, if care is taken while instances are created to identify locations where a particular instance cell has similar interactions with neighboring layout geometries and structures, the number of unique instances created can be reduced. For example, if there is an instance in the IB representation where a instance cell C is interacting with a geometry from instance cell B as well as a geometry from instance cell A in a particular fashion, other locations where C has the same type of proximity interaction with the same geometries can be represented as a master instance and one or more slave instances. In general a master instance includes all the information regarding the instance such as location, orientation and geometric features. Slave instances only include information unique to the slave instance such as location and orientation of the slave instance. Other information, which is shared in common by the master instance and the slave instances are obtained from the master instance.

The term instance has two meanings, the applicable one should be apparent from use. To repeat, in the context of a standard hierarchical layout, or non-IB representation, an instance is a particular instance cell (e.g. its geometry, contained instance cells, and/or other information, e.g. connectivity information, netlist information and/or information on coloring schemes). Thus, if a standard hierarchical layout includes five instances of an instance cell C, then the instance cell C appears five times (at various rotations, orientations, positions, etc.) within the layout. In contrast, in an IB representation, an instance refers to a specific environment for a given instance cell. For example, when a given IB representation has two instances of an instance cell, e.g. the instance cell $C_P$, that means there are two locations where instance cell C has identical interactions with nearby geometries. To reduce the size of the IB representation, the IB instance cells with identical interactions with nearby geometries are usually stored as a master instance and one or more slave instances. For clarity references for IB representation instance cells will be include a suffix "_IB". Furthermore master instances may be preceded by a prefix "M_" and slave instances may be preceded by a prefix "S_". In addition for multiple slave instances having the same reference names a numerical suffix may be appended to the reference name. For example a sample instance cell SAMP may have a master sample instance cell M_SAMP_IB, and 4 slave sample instance cells S_SAMP_IB_01, S_SAMP_IB_02, S_SAMP_IB_03, and S_SAMP_IB_04.

Returning to the layout shown in FIGS. 1A–1C, consider the instance of instance cell C (shown visually in FIG. 1B). Note that only the geometry of the single shape within C is available within the instance cell in the standard hierarchical layout. Contrast the standard instance cell with the IB representation shown in FIG. 1D as instance cell $C_P$_IB. Here, the interaction range of instance cell $C_P$_IB is shown as a dotted line. The portions of nearby geometries within T that interact with the geometries within instance cell C are included inside the boundary of instance cell $C_P$_IB. More particularly, a portion of the geometry in T, a portion of instance cell B and a portion of geometry from within instance cell A are included within instance cell $C_P$_IB.

Figure 1D:
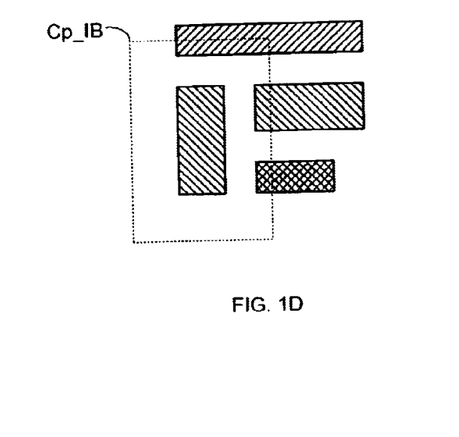
FIG. 1D illustrates an instance cell from an instance-based representation of the layout of FIG. 1A.

The instance cells can either directly store the geometrical information about the interacting geometries (e.g. the small rectangles for the portions of the three structures within the dotted lines) or can store references to the relevant geometric shapes themselves together with information about the relevant portions of those shapes that interact with instance cell C in instance $C_P$_IB. The latter approach is used by some embodiments of the invention to reduce memory requirements (pointers/references generally require less storage space than additional geometrical shape information).

Figure 2A:
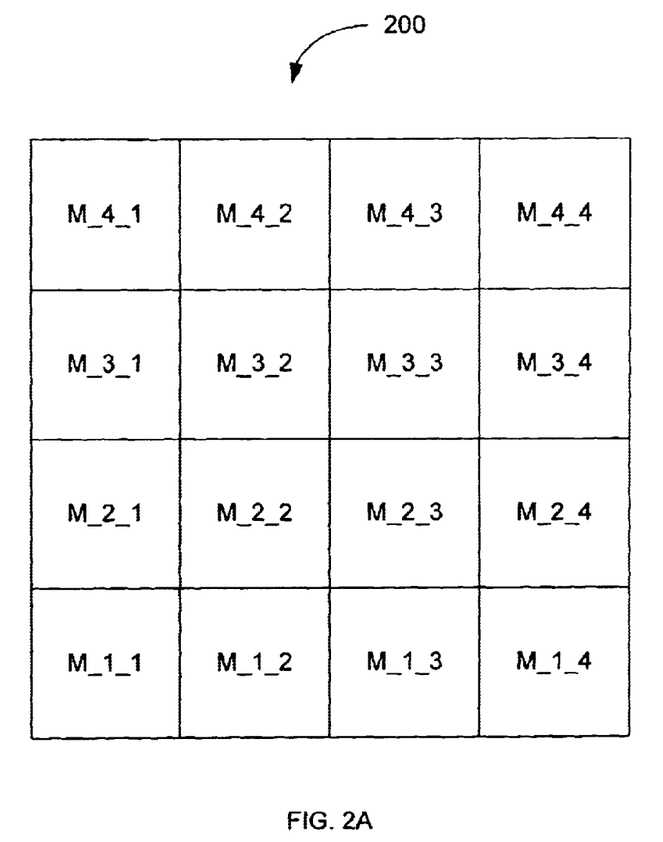
FIGS. 2A–2J illustrate the principles of instance based representation of a layout.

FIGS. 2A–2J further illustrate the use of instance based representation. Specifically FIG. 2A illustrates a simplified block diagram of a 4×4 array 200 of an instance cell M. For clarity the individual instance cells of 4×4 array 200 are numbered as M_X_Y, where X and Y are integers between 1 and 4 inclusive. M_1_1 is at the bottom left corner, M_1_4 is at the bottom right corner, M_4_1 is at the top left corner, and M_4_4 is at the top right corner. A non-IB based representation may consider each instance cell of 4×4 array 200 to be identical. However in an IB-representation, a halo surrounding each instance cell must be considered. The principles of master instance cells and slave instance cells can be used on any type of layout at various levels of granularity. For example, the individual cells of array 200 could represent whole memory cells, individual transistors, or even simple geometric shapes in a layout.

Figure 2B:
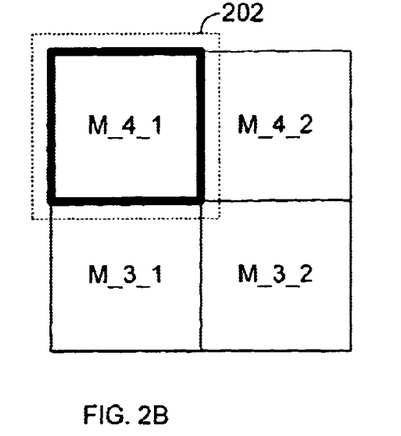

As illustrated in FIG. 2B, a halo 202 around instance cell M_4_1 includes portions of three other instance cells. Specifically, halo 202 around instance cell M_4_1 includes a right neighbor (instance cell M_4_2), a bottom neighbor (instance cell M_3_1), and a bottom right neighbor (instance cell M_3_2). No other instance cell in array 200 has an identical arrangement. In an IB representation instance cell M_4_1_IB refers to the instance cell M_4_1 and the required information in halo 202. In an IB representation including only array 200, instance cell M_4_1_

IB would be a master instance with no slave instances. However, if an IB representation includes other copies of array 200, then the IB representation may include slave instance cells which reference instance cell M_4_1_IB as a master instance cell. For clarity instance cell M_4_1_IB can be referred to as a top left corner instance cell TLC_IB.

Figure 2C:
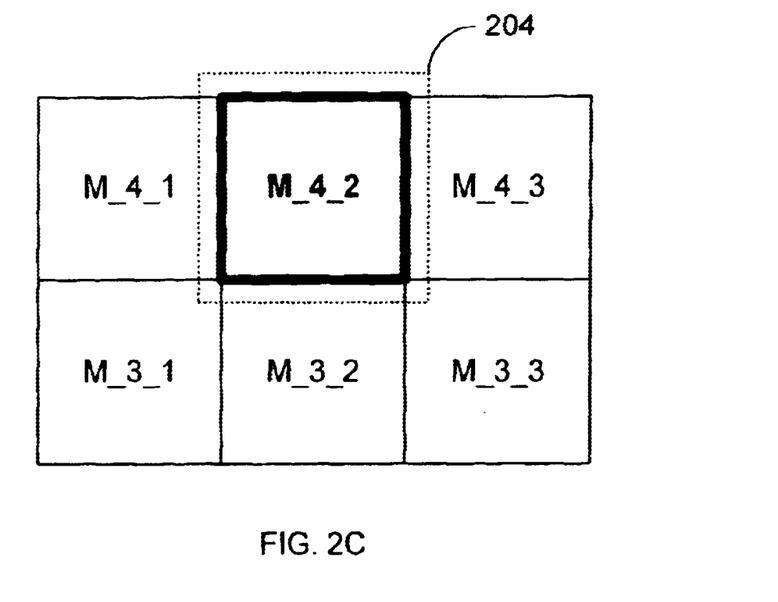

As illustrated in FIG. 2C, a halo 204 around instance cell M_4_2 includes portions of 5 other instance cells. Specifically, halo 204 around instance cell M_4_2 includes a left neighbor (instance cell M_4_1), a bottom left neighbor (instance cell M_3_1), a bottom neighbor (instance cell M_3_2), a bottom right neighbor (instance cell M_3_3), and a right neighbor (instance cell M_4_3). Instance cell M_4_3 has the same neighbor arrangement as instance cell M_4_2. Thus in an IB representation a instance cell M_4_2_IB could be a master instance with instance cell M_4_3_IB being a slave instance. For clarity instance cell M_4_2_IB can be referred to as a top side instance cell TS_IB.

Figure 2D:
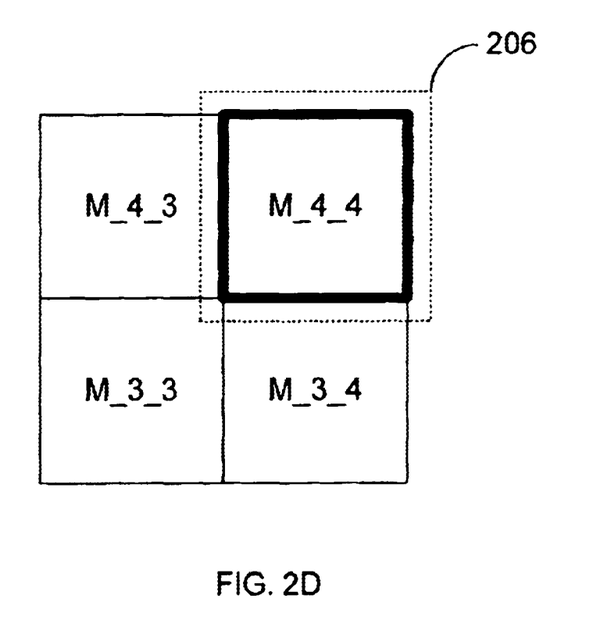

As illustrated in FIG. 2D, a halo 206 around instance cell M_4_4 includes portions of three other instance cells. Specifically, halo 206 around instance cell M_4_4 includes a left neighbor (instance cell M_4_3), a bottom neighbor (instance cell M_3_4), and a bottom left neighbor (instance cell M_3_3). No other instance cell in array 200 has an identical arrangement. For clarity instance cell M_4_4_IB can be referred to as a top right corner instance cell TRC_IB.

Figure 2E:
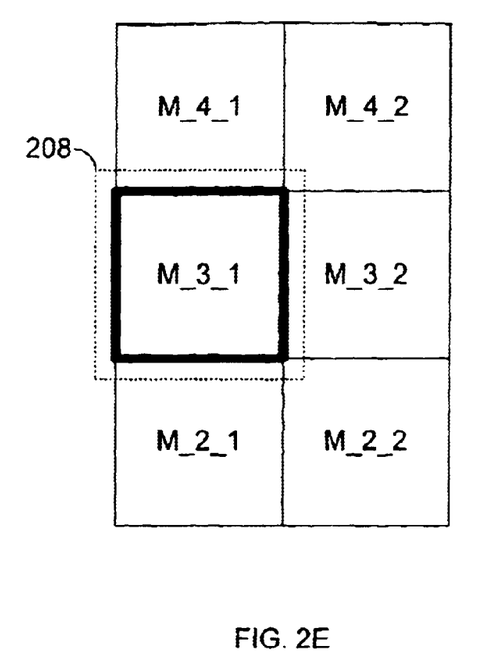

In FIG. 2E, a halo 208 around instance cell M_3_1 includes portions of 5 other instance cells. Specifically, halo 208 around instance cell M_4_2 includes a top neighbor (instance cell M_4_1), a top right neighbor (instance cell M_4_2), a right neighbor (instance cell M_3_2), a bottom right neighbor (instance cell M_2_2), and a bottom neighbor (instance cell M_2_1). Instance cell M_2_1 has the same neighbor arrangement as instance cell M_3_1. Thus, in an IB representation, instance cell M_3_1_IB could be a master instance with instance cell M_2_1_IB being a slave instance. For clarity instance cell M_3_1_IB can be referred to as a left side instance cell LS_IB.

Figure 2F:
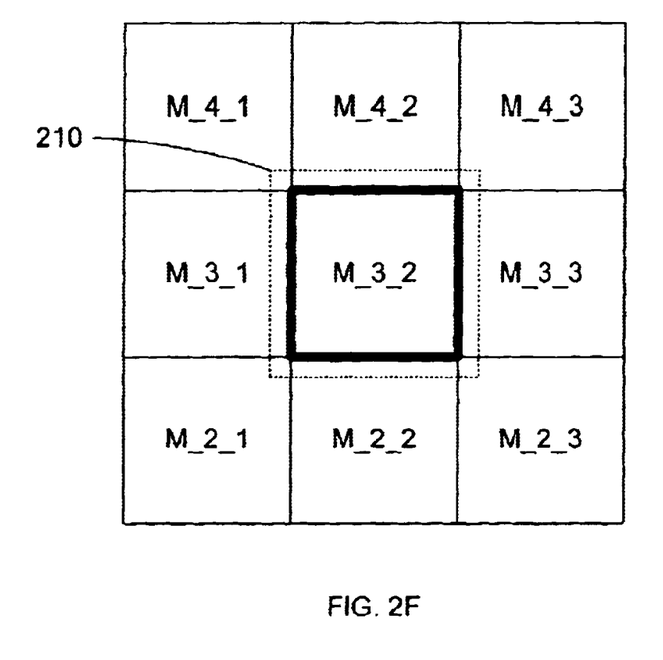

In FIG. 2F, a halo 210 around instance cell M_3_2 includes portions of 8 other instance cells. Specifically, halo 208 around instance cell M_3_2 includes a top neighbor (instance cell M_4_2), a top right neighbor (instance cell M_4_3), a right neighbor (instance cell M_3_3), a bottom right neighbor (instance cell M_2_3), a bottom neighbor (instance cell M_2_2), a bottom left neighbor (instance cell M_2_1), a left neighbor (instance cell M_3_1, and a top left neighbor (instance cell M_4_1). Instance cells M_3_3, M_2_2, and M_2_3 have the same neighbor arrangement as instance cell M_3_2. Thus in an IB representation an instance cell M_3_2_IB could be a master instance with instance cell M_2_3_IB, M_2_2_IB, and M_2_3_IB being slave instances. For clarity instance cell M_3_2_IB can be referred to as a center instance CEN_IB.

Figure 2G:
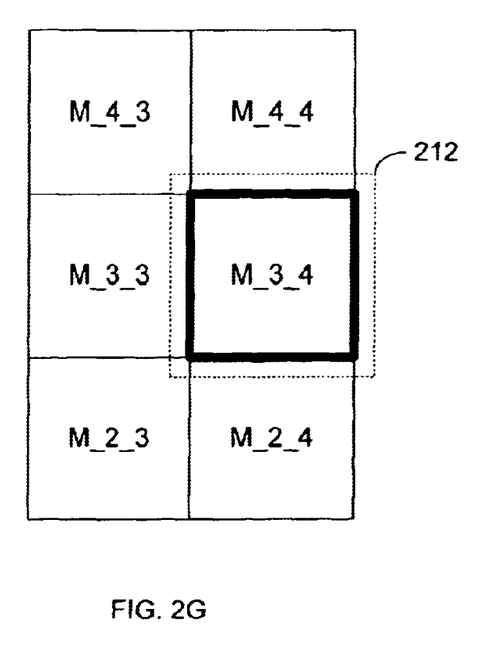

In FIG. 2G, a halo 212 around instance cell M_3_4 includes portions of 5 other instance cells. Specifically, halo 208 around instance cell M_3_4 includes a top neighbor (instance cell M_4_4), a bottom neighbor (instance cell M_2_4), a bottom left neighbor (instance cell M_2_3), a left neighbor (instance cell M_3_3, and a top left neighbor (instance cell M_4_3). Instance cell M_2_4 has the same neighbor arrangement as instance cell M_3_4. Thus in an IB representation an instance cell M_3_4_IB could be a master instance with instance cell M_2_4_IB being a slave instance. For clarity instance cell M_3_4_IB can be referred to as a right side instance cell RS_IB.

Figure 2H:
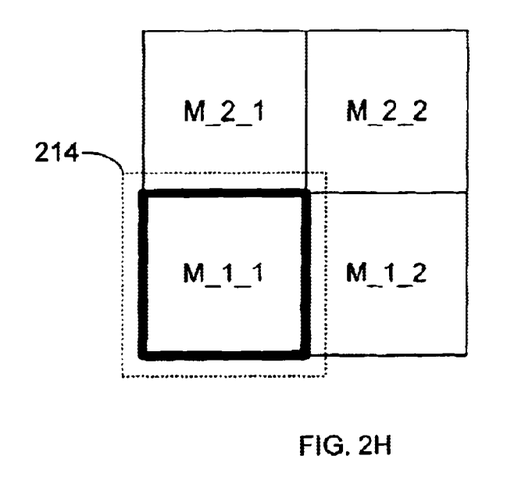

As illustrated in FIG. 2H, a halo 214 around instance cell M_1_1 includes portions of three other instance cells. Specifically, halo 214 around instance cell M_1_1 includes a right neighbor (instance cell M_1_2), a top neighbor (instance cell M_2_1), and a top right neighbor (instance cell M_2_2). No other instance cell in array 200 has an identical arrangement. For clarity instance cell M_1_1_IB can be referred to as a bottom left corner instance cell BLC_IB.

Figure 2I:
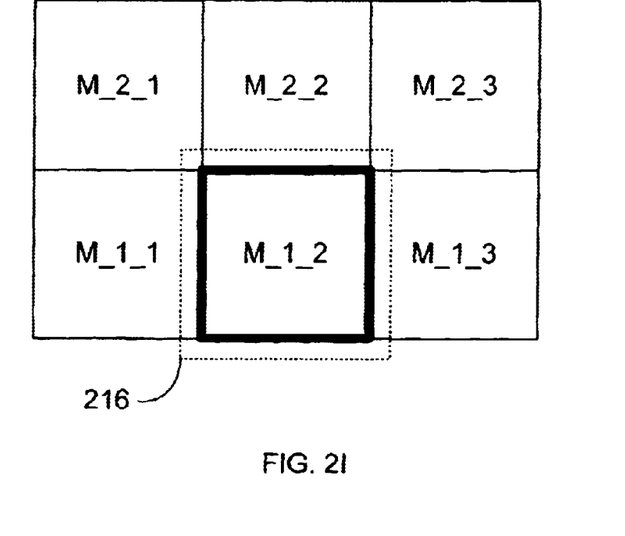

In FIG. 2I, a halo 216 around instance cell M_1_2 includes portions of 5 other instance cells. Specifically, halo 208 around instance cell M_1_2 includes a top neighbor (instance cell M_2_2), a top right neighbor (instance cell M_2_3), a right neighbor (instance cell M_1_3), a left neighbor (instance cell M_1_1, and a top left neighbor (instance cell M_2_1). Instance cell M_1_3 has the same neighbor arrangement as instance cell M_1_2. Thus in an IB representation an instance cell M_1_2_IB could be a master instance with instance cell M_1_3_IB being a slave instance. For clarity instance cell M_1_2_IB can be referred to as a bottom side instance BS_IB.

Figure 2J:
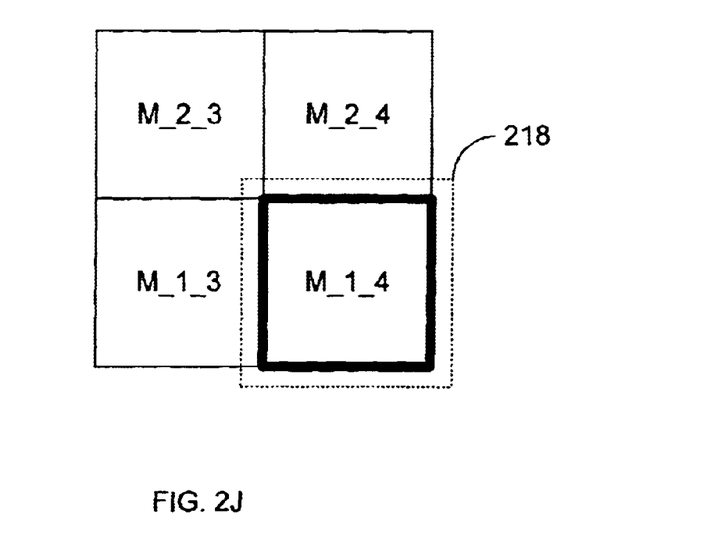

As illustrated in FIG. 2J, a halo 218 around instance cell M_1_4 includes portions of three other instance cells. Specifically, halo 218 around instance cell M_1_4 includes a left neighbor (instance cell M_1_3), a top neighbor (instance cell M_2_4), and a top left neighbor (instance cell M_2_3). No other instance cell in array 200 has an identical arrangement. For clarity instance cell M_1_4_IB can be referred to as a bottom right corner instance cell BRC_IB.

Thus, an IB representation of array 200 would contain 9 master instances and 7 slave instances. Specifically, the nine master instance cells would include a master top left corner instance cell M_TLC_IB, a master top side instance cell M_TS_IB, a master top right corner instance cell M_TRC_IB, a master right side instance cell M_RS_IB, a master bottom right corner instance cell M_BRC_IB, a bottom side instance cell M_BS_IB, a bottom right corner instance cell M_BRC_IB, a master right side instance cell M_RS_IB, and a master center instance cell M_CEN_IB. The seven slave instances would include one slave top side instance cell S_TS_IB_01, one slave right side instance cell S_RS_IB_01, one slave bottom side instance cell S_BS_IB_01, one slave bottom side instance cell S_BS_IB_01, and three slave center instance cell S_CEN_IB_01, S_CEN_IB_02, and S_CEN_IB_03. If array 200 were expanded to a larger array the same 9 master instances would remain with additional slave instances. For example an IB representation of a layout having a 10×10 array would include the nine master instance cells and seven slave top side instance cell S_TS_IB_01 to S_TS_IB_07, seven slave right side instance cell S_RS_IB_01 to S_RS_IB_07, seven slave bottom side instance cell S_BS_IB_01 to S_BS_IB_07, seven slave bottom side instance cell S_BS_IB_01 to S_BS_IB_07, and sixty-three slave center instance cell S_CEN_IB_01, to S_CEN_IB_63.

An IB representation of a layout containing multiple arrays would still only need the 9 master instance cells and assorted slave instance cells assuming the arrays are spaced far enough away from other features so that the various halos of the cells would not include other instances. In cases where some other features do protrude into the halo of a cell that particular cell would likely become a master instance cell.

As explained above the master instance cells contain all the information regarding the instance such as location, orientation and geometric features. Slave instances only include information unique to the slave instance such as location and orientation of the slave instance. Thus, an IB representation of a layout can be considerably smaller. Furthermore, by using instances having the same geometry many processes required in the manufacturing of integrated circuit can be performed in parallel.

Figure 3A:
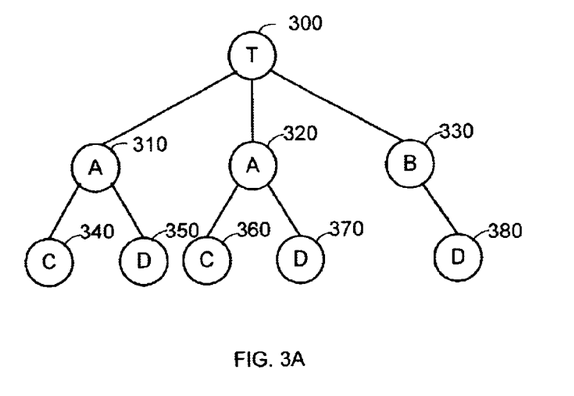
FIG. 3A illustrates a design hierarchy for a layout.

FIG. 3A illustrates a design hierarchy for a layout T 300. Layout T 300 includes two instances of the cell A, 310 and 320, as well as an instance of cell B 330. The first instance of the cell A 310 includes an instance of the cell C 340 and an instance of the cell D 350. Similarly, the second instance of the cell A includes an instance of the cell C 360 and an instance of the cell D 370. Cell B 330 includes an instance of the cell D 380.

Figure 3B:
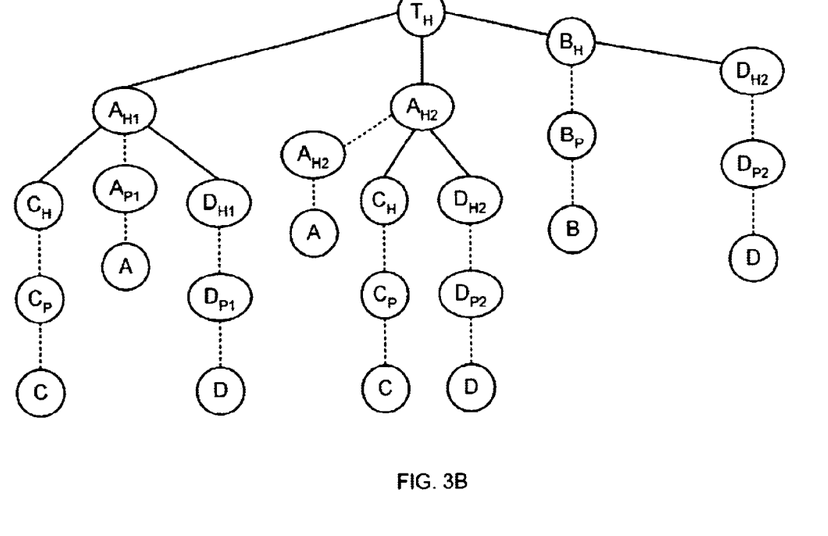
FIG. 3B illustrates a modified design hierarchy for the layout in accordance with an embodiment of the invention.

FIG. 3B illustrates a modified design hierarchy for a layout in accordance with an embodiment of the invention. It is convenient to use this modified representation in generating the instance-based representation of the layout because the modified representation allows each node to encapsulate environmental information from its parent node as well as neighboring nodes.

This modified hierarchy is generated by replacing each node in the original hierarchical representation (as illustrated in FIG. 3A) with three nodes, including a holding cell, a physical cell and an actual cell. The holding cell acts as a placeholder for the original cell. The physical cell contains information on environmental factors from a parent node or neighboring nodes that affect the node. For example, these environmental factors can include, geometries, connectivity information, netlist information and/or information on coloring schemes. The physical cell also specifies areas of interest for the node. Finally, the actual cell can include the original cell.

The basic rule is that physical cells do not point to each other. In some cases, a holding cell and a physical cell can be merged into a single cell, so long as the basic rule is not violated.

Figure 4:
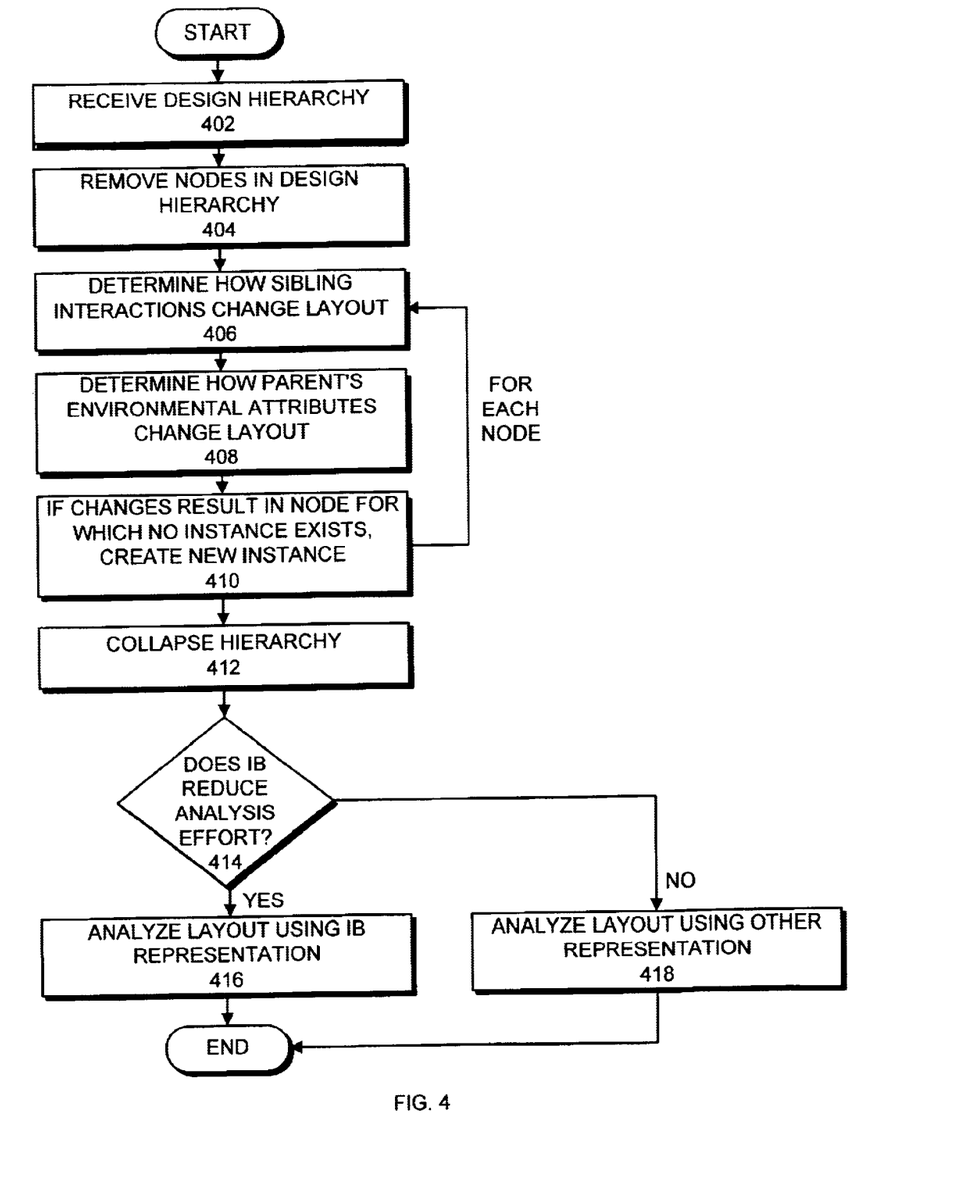
FIG. 4 is a flow chart illustrating the process of generating an instance-based representation from a hierarchical representation in accordance with an embodiment of the invention.

FIG. 4 is a flow chart illustrating the process of generating an instance-based representation from a hierarchical representation in accordance with an embodiment of the invention. The process starts by receiving a design hierarchy specifying the layout of the circuit (step 402). The system then replaces nodes in the hierarchy as is illustrated in FIGS. 3A and 3B. (step 404).

Next, for each node in the hierarchy, the system determines how interactions with siblings change the layout of the node (step 406). For example, a geometrical feature within a sibling node may cause a coloring conflict or a design rule violation that has to be remedied by modifying the layout of the node. The system also determines how the parent's environmental attributes change the layout (step 408). For example, in FIG. 5 a geometrical feature 502 defined within parent node 300 may cause a coloring conflict or design rule violation that must be remedied by changing the layout of the node. Finally, if any of these changes result in a new instance for which no instance has been created, the system creates a new instance (step 410).

In one embodiment of the invention, during the above-described process, the nodes are visited in topological order. This ensures that all instances of a parent node are created before a child node is analyzed.

In one embodiment of the invention, all instances of a master cell are generated before going on to the next cell.

Next, the design hierarchy is collapsed so that only the instances remain (step 412).

Note that an IB representation will not necessarily reduce the amount of layout that must be considered during subsequent analysis operations. For example, if instances are not repeated in a layout, the total layout area that must be analyzed is not reduced by using an IB representation. Therefore, it may be more efficient to use other representations in some situations.

In order to deal with these situations, the system additionally determines whether the IB representation will reduce analysis effort below a threshold value (step 414). If so, the system performs an analysis, such as OPC, on the layout using the IB representation (step 416). Otherwise, the system performs the analysis on the layout using another representation, e.g. a flat, non-hierarchical, representation (step 418).

Note that given any point (x, y) in a layout, there is one and only one unique instance associated with that point (x, y) in the layout. Furthermore, the union of the instances is equivalent to the layout.

Figure 5:
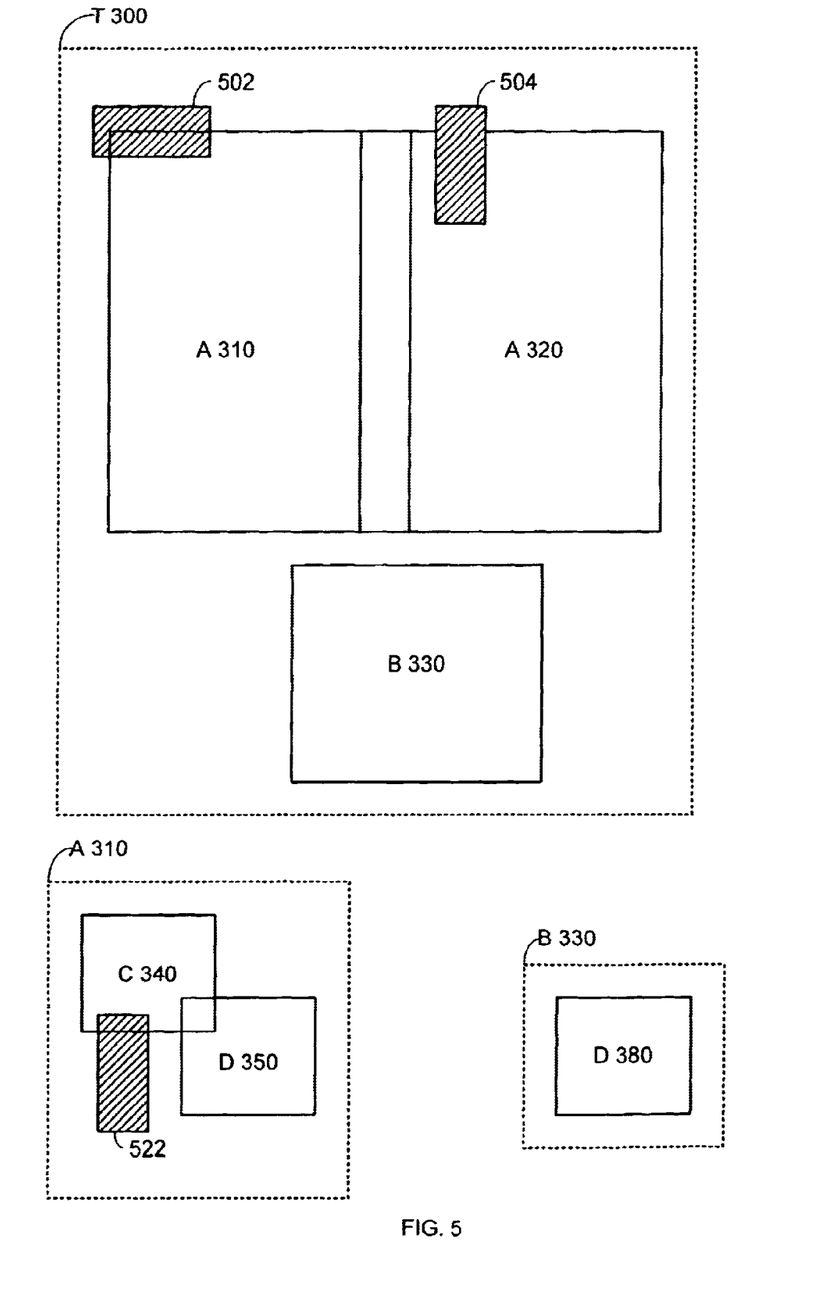
FIG. 5 presents an example of a hierarchical layout in accordance with an embodiment of the invention.

FIG. 5 presents an example of a hierarchical layout in accordance with an embodiment of the invention. This layout is a graphical representation of the layout illustrated in FIG. 3A. Within FIG. 5, a layout T 300 includes two instances of the cell A, 310 and 320, as well as an instance of the cell B 330. The first instance of the cell A 310 includes an instance of the cell C 340 and an instance of the cell D 350. The second instance of cell A 320 (not shown in FIG. 5) includes an instance of the cell C 360 and an instance of the cell D 370. Cell B 330 also includes an instance of the cell D 380.

In this graphical representation, layout T 300 includes two geometrical features 502 and 504 in additional to cells A 310, A 320 and B 330. Note that geometrical feature 502 affects the layout of cell A 310, and that geometrical feature 504 affects the layout of cell A 320. Also note that cell A 310 may affect the layout of neighboring cell A 320. Similarly, cell A 320 may affect the layout of neighboring cell A 310.

Consequently the system creates two instances of cell A. The first instance A 310 includes the effects of geometrical feature 502 and neighboring cell A 320. The second instance A 320 includes the effects of geometrical feature 504 and neighboring cell A 310.

The definition of cell A 310, which appears at the bottom of FIG. 5, includes cells C 340 and D 350 in addition to geometrical feature 522. Note that geometrical feature 522 affects the layout of cell C 340. Furthermore, cell C 340 can affect the layout of neighboring cell D 350, and cell D 350 can affect the layout of neighboring cell C 340. This causes the system to create an instance of the cell C 340 that includes the effects of geometrical feature 522 and neighboring cell D 350. This is the only instance created for cell C 340 because the other instance of cell C 360 under cell A 320 is the same as the instance of cell C 340 under cell A 310. The system also creates an instance of the cell D 350 that includes the effects of neighboring cell C 340.

Note that the definition of cell B 330 includes an instance of cell D 380, and this instance of cell D 380 is not affected by neighboring nodes or geometrical features defined within cell B 330. Hence, the system creates a second instance of the cell D 380 that includes no effects from neighboring cells or geometrical features.

Moreover, note that it may be possible for factors that affect cell A to also affect cells C and D. For example, if geometrical feature 502 overlaps cell C 340, another instance of cell C 340, which includes the effects of geometrical feature 502, may have to be created. Hence, it is important to create all instances of parent cell A before creating instances of a child cells C and D because the different instances of the parent cell A may create additional instances of the child cells C and D.

Note that by using an instance-based representation, a computational task can be easily partitioned so that different instances are processed by different threads. This facilitates parallel processing and/or pipelined execution for computational tasks, such as optical proximity correction and design rule checking.

Figure 6:
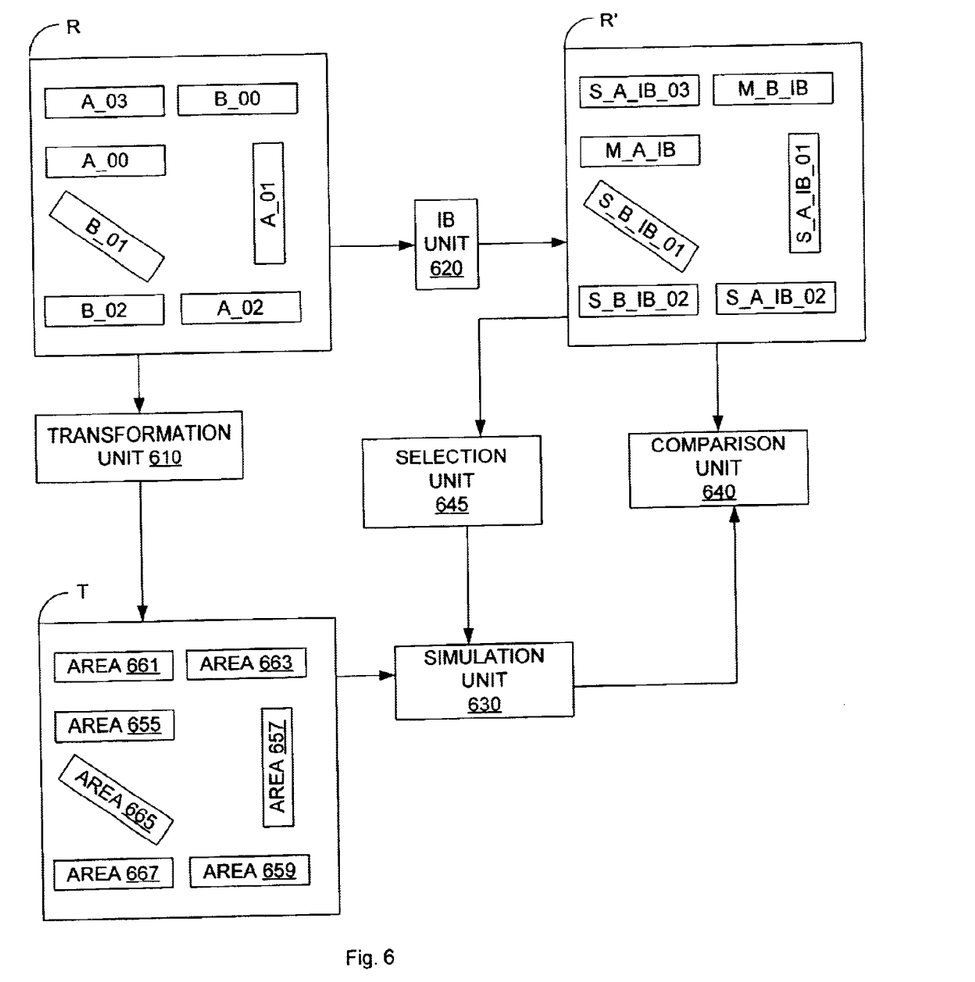
FIG. 6 presents an example of verifying a transformed layout using an instance based representation.

FIG. 6 illustrates a verification process that uses an instance based representation to reduce the time and computational complexity required to verify a layout. Specifically, FIG. 6 shows a very simplified reference layout R having instance cells A_00, A_01, A_02, A_03, B_00, B_01, and B_02. For clarity the instance cells of reference layout R are spaced apart to avoid halo effects. However for actual layouts halo effects in converting to IB representations must be accounted for as described above.

Reference layout R has been transformed into a transformed layout T by a transformation unit 610. Transformed layout T can be for example the product of OPC or PSM on reference layout R. Transformed layout T would include areas 655, 657, . . . 667, which correspond to instance cells A_00, A_01, A_02, A_03, B_00, B_01, and B_02, respectively. The hierarchy of reference layout R is likely to differ greatly from the hierarchy of transformed layout T. Thus the comparison between reference layout R and transformed layout T is very difficult and time consuming. For example, if transformed layout T is formed by an OPC process, simulation is performed on transformed layout T to determine whether transformed layout T would generate the proper geometries as dictated by reference layout R. Specifically, for each instance cell in reference layout R the corresponding area in transformed layout T must be simulated to create a simulated silicon image, which is compared to the geometry in the instance cell of reference layout R.

However, in accordance with the present invention, reference layout R is also transformed into an IB based representation R' by an IB unit 620. As explained above, in an IB based representation instance cells include master cells and slave cells that have the same geometrical layout as the master cells. As illustrated in FIG. 6, IB based representation R' contains a master instance cell M_A_IB corresponding to instance cell A_00, slave instance cells S_A_IB_01, S_A_IB_02, S_A_IB_03 corresponding to instance cells A_01, A_02, and A_03, a master instance cell M_B_IB corresponding to instance cell B_00, and slave instance cells S_B_01 and S_B_02, which correspond with instance cells B_01 and B_02, respectively.

Because each instance cell of IB based representation R' is created to account for halo effects, the interior of the slave instance cells are identical to the corresponding master instance cells. Therefore, in accordance with the principles of the present invention, verification of transformed layout T can be accomplished by simulating and comparing a subset of each set of master instance cell and the slave instance cells. A selection unit 645 selects instance cells for the subset of instance cells. However, for the simple layouts of FIG. 6, verification of transformed layout T can be accomplished by simulating area 655 which corresponds to master instance cell M_A_IB and area 663, which corresponds to master instance cell M_B_IB using simulation unit 630. The simulated results (e.g. a simulated silicon image) of area 655 and area 663 are compared with the geometry in master instance cell M_A_IB and master instance cell M_B_IB, respectively, by comparison unit 640. In general a verification report is generated by copying the result of the comparison for the master instance cell for each slave instance that was not actually simulated and compared.

Figure 7:
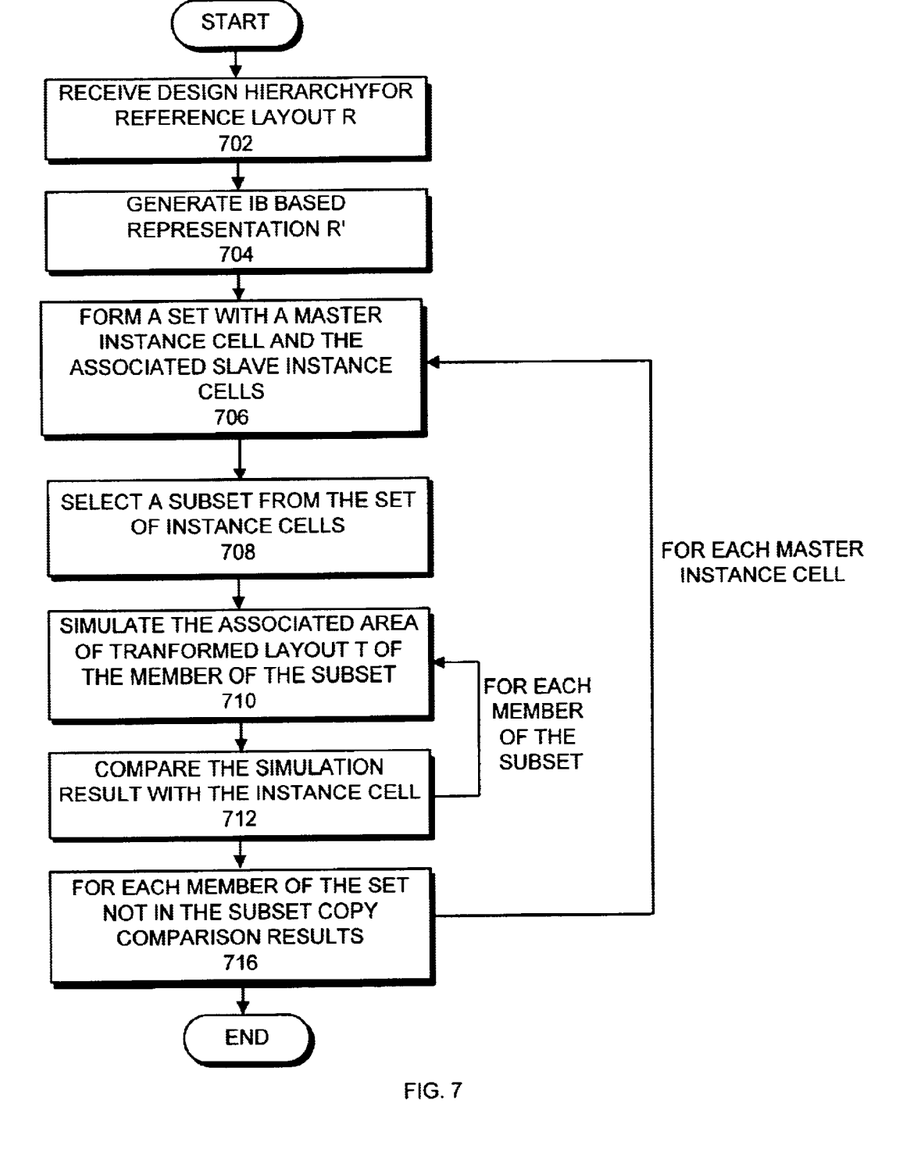
FIG. 7 is a flow chart illustrating the process of verifying a transformed layout using an instance based representation.

FIG. 7 is a flow chart illustrating the process of verifying a transformed layout T generated from a reference layout R in accordance with an embodiment of the invention. The process starts by receiving a design hierarchy representing reference layout R (step 702). The system then generates an IB based representation R' from reference layout R (step 704).

Next, for each master instance cell in IB based representation R', a set of instance cells comprising the master instance cell and the associated slave instance cells is formed (step 706). Then, a subset of the set of instance cells is selected (step 708). Most embodiments of the present invention would include the master instance cell in the subset. The number and method of selecting the other members of the subset can vary. For example, in one embodiment of the present invention, the subset includes only the master instance cell in the subset of instance cells. In other embodiments a random selection of the instance cells are is chosen to make up the subset. For example in one embodiment of the present invention, 10% of the instance cells of a set are selected randomly to be in the subset that are actually verified. Still other embodiments may have a specific selection routine. For example in one embodiment of the present invention every 10th member of the set is selected for the subset.

The instance cells in the subset are then verified by simulating the corresponding area of transformed layout T (step 710). Then the simulated results are compared with the instance cell. (step 710). Steps 710 and 712 are performed for each instance cell of the subset.

Then for each member of the cell that is not in the subset comparison data is copied from an instance cell that was in the subset to create a complete verification report (step 716). Steps 706, 708, 710, 712, and 716 are repeated for each master instance.

In some embodiments of the present invention, if an error is discovered in the comparison of the simulation result with the instance cell (step 712). Processing of the current set of instance cells is stopped and the error is copied into to all members of the set. These embodiments operate under the principle that if any error occurs it creates a problem that must be rectified and therefore no more time should be spent verifying instance cells in a set that has a problem.

Thus according to the principles of the present invention verification of a transformed layout can be performed more quickly using an instance based hierarchy. The various embodiments of the structures and methods of this invention that are described above are illustrative only of the principles of this invention and are not intended to limit the scope of the invention to the particular embodiments described. For example, in view of this disclosure, those skilled in the art can define other transformations, hierarchies, Instance based hierarchies, simulation units, comparison units, layouts and so forth, and use these alternative features to create a method or system according to the principles of this invention. Thus, the invention is limited only by the following claims.

What is claimed is:

1. A method of verifying a transformed layout of a reference layout, the method comprising:

receiving a representation of the reference layout;

converting the representation of the reference layout to an instance based representation, the instance based representation comprising a first set of instance cells and a second set of instance cells;

selecting a first subset of instance cells from the first set of instance cells;

simulating an area of the transformed layout corresponding to each instance cell in the first subset of instance cells to generate a simulation image; and comparing the simulation image to a corresponding instance cell of the first subset of instance cells to generate a comparison result.

2. The method of claim 1, further comprising copying the comparison result for each instance cell of the first set of instance cells, which are not included in the first subset of instance cells.

3. The method of claim 1, wherein the first set of instance cells comprises a master instance cell.

4. The method of claim 3, wherein the first set of instance cells further comprises one or more slave instance cells.

5. The method of claim 4, wherein the first subset of instance cells consists of the master instance cell.

6. The method of claim 4, wherein the first subset of instance cells comprises the master instance cells and one or more slave instance cells.

7. The method of claim 1, wherein the simulation image is a simulated silicon image.

8. The method of claim 1, further comprising:

selecting a second subset of instance cells from the second set of instance cells;

simulating an area of the transformed layout corresponding to each instance cell in the second subset of instance cells to generate a simulation image; and comparing the simulation image to a corresponding instance cell of the second subset of instance cells to generate a comparison result.

9. The method of claim 8, further comprising copying the comparison result for each instance cell of the second set of instance cells, which are not included in the second subset of instance cells.

10. The method of claim 1, wherein the first set of instance cells comprises a master instance cell and one or more slave instance cells.

11. The method of claim 10, wherein the first subset of instance cells consists of the master instance cell.

12. The method of claim 10, wherein the first subset of instance cells comprises the master instance cells and one or more slave instance cells.

13. A computer-readable storage medium storing instructions that when executed by a computer causes the computer to perform a method for verifying a transformed layout of a reference layout, the method comprising:

receiving a representation of the reference layout;

converting the representation of the reference layout to an instance based representation, the instance based representation comprising a first set of instance cells and a second set of instance cells;

selecting a first subset of instance cells from the first set of instance cells;

simulating an area of the transformed layout corresponding to each instance cell in the first subset of instance cells to generate a simulation image; and comparing the simulation image to a corresponding instance cell of the first subset of instance cells to generate a comparison result.

14. The computer-readable storage medium of claim 13, wherein the method further comprises copying the comparison result for each instance cell of the first set of instance cells, which are not included in the first subset of instance cells.

15. The computer-readable storage medium of claim 13, wherein the first set of instance cells comprises a master instance cell.

16. The computer-readable storage medium of claim 13, wherein the first set of instance cells further comprises one or more slave instance cells.

17. The computer-readable storage medium of claim 13, wherein the first subset of instance cells consists of the master instance cell.

18. The computer-readable storage medium of claim 13, wherein the first subset of instance cells comprises the master instance cells and one or more slave instance cells.

19. The computer-readable storage medium of claim 13, wherein the simulation image is a simulated silicon image.

20. A verification tool configured to verify a transformed layout of a reference layout, the verification tool comprising:

an IB unit configured to convert a representation of the reference layout to an instance based representation, the instance based representation comprising a first set of instance cells and a second set of instance cells;

a selection unit configured to select a first subset of instance cells from the first set of instance cells;

a simulation unit configured to simulate an area of the transformed layout corresponding to each instance cell in the first subset of instance cells to generate a simulation image; and a comparison unit configured to compare the simulation image to a corresponding instance cell of the first subset of instance cells to generate a comparison result.

21. The verification tool of claim 20, further comprising copying unit that copies the comparison result for each instance cell of the first set of instance cells, which are not included in the first subset of instance cells.

* * * * *